United States Patent
Hu et al.

(10) Patent No.: US 6,642,672 B2
(45) Date of Patent: Nov. 4, 2003

(54) INTEGRATED FILTER WITH COMMON-MODE AND DIFFERENTIAL-MODE FUNCTIONS

(75) Inventors: Yue Quan Hu, Taoyuan Sien (TW); Jiang Tao Feng, Taoyuan Sien (TW); Wei Chen, Taoyuan Sien (TW)

(73) Assignee: Delta Electronics, Inc., Taoyuan Sien (TW)

( * ) Notice: Subject to any disclaimer, the term of this patent is extended or adjusted under 35 U.S.C. 154(b) by 0 days.

(21) Appl. No.: 10/165,481

(22) Filed: Jun. 7, 2002

(65) Prior Publication Data

US 2002/0195973 A1 Dec. 26, 2002

(30) Foreign Application Priority Data

Jun. 8, 2001 (CN) .......................................... 01121117 A

(51) Int. Cl.[7] .............................................. H05B 41/16
(52) U.S. Cl. ........................ 315/276; 315/278; 333/181; 336/212
(58) Field of Search ................................. 315/276, 278, 315/141, 223; 333/181–185, 178; 336/172, 212, 181, 155

(56) References Cited

U.S. PATENT DOCUMENTS

| | | | | |
|---|---|---|---|---|
| 5,083,101 A | * | 1/1992 | Frederick | 336/212 |
| 5,313,176 A | * | 5/1994 | Upadhyay | 333/181 |
| 5,319,343 A | | 6/1994 | Jeffries | 336/181 |
| 5,528,205 A | * | 6/1996 | Wong | 333/177 |
| 5,581,224 A | * | 12/1996 | Yamaguchi | 336/212 |
| 5,731,666 A | | 3/1998 | Folker et al. | 315/276 |
| 5,969,583 A | * | 10/1999 | Hutchison | 333/181 |
| 6,323,602 B1 | * | 11/2001 | De Groot et al. | 315/276 |

* cited by examiner

Primary Examiner—Haissa Philogene
Assistant Examiner—Ephrem Alemu
(74) Attorney, Agent, or Firm—Thomas, Kayden, Horstemeyer & Risley

(57) ABSTRACT

An integrated filter with both common-mode and differential-mode functions is disclosed. The integrated filter comprises a magnetic core, two windings and a frame for installing the windings. The magnetic core further comprises a rectangular core and an I-shaped core. The frame is fixed to a column of the rectangular core. These two windings are wound on the frame. The I-core is placed across an interior opening of the rectangular core and between these two windings. One integrated filter with a magnetic core composed of a θ-shaped core and an I-shaped core is also disclosed. In addition, the magnetic core may comprise a θ-shaped core and an E-shaped core. The E-core is placed across an interior opening of the θ-shaped core or upright on the θ-shaped core and between these two windings. One integrated filter with a magnetic core composed of a rectangular core and an E-shaped core is also disclosed.

19 Claims, 11 Drawing Sheets

INTEGRATED FILTER WITH COMMON-MODE AND DIFFERENTIAL-MODE FUNCTIONS

BACKGROUND OF THE INVENTION

1. Field of the Invention

The present invention pertains in general to a filter and, more particularly, to an integrated filter with both common-mode and differential-mode functions.

2. Description of the Related Art

For an electric power circuit, electromagnetic interference (hereafter called EMI) signals are unavoidably generated by the on-off switching operations of the power line. These EMI signals are generally classified into radiation-type and conductive-type. In addition, the conductive-type EMI signal includes a differential-mode component and a common-mode noise component, respectively. These EMI signals do not only affect the operation of the circuit itself, but also influence the working of other electronic equipment by radiation or conduction. It is therefore necessary to take steps to suppress this interference.

FIGS. 1A and 1B (Prior Art) illustrate an example of various types of EMI signals and their propagation schemes. A conventional filter with differential-mode and common-mode functions can be separated into a common-mode filter and a differential-mode filter. As shown in FIGS. 1A and 1B, the common-mode filter is comprised of inductor L101 and inductor L102. In addition, the differential-mode filter is comprised of inductor L103 and an inductor L104. FIG. 1A illustrates the propagation scheme of common-mode interference signals. These interference signals are generated between wires and the ground. This kind of interference signal is referred to as common-mode since it has the same phases and amplitudes. FIG. 1B (Prior Art) illustrates the propagation scheme of differential-mode interference signals. This kind of interference signal is generated between two wires and referred to as differential-mode. Generally speaking, inductor L101 and inductor L102 have larger inductance values to suppress common-mode interference signals. Inductors L101 and L102, shown in the figure, are common-mode inductors wound on the same magnetic core. In addition, inductors L103 and L104 are serially connected to the circuit for suppressing the differential-mode interference signals.

The conventional filter as shown in FIGS. 1A and 1B is implemented by separated common-mode filters and differential-mode filters. Currently, there is a proposal to integrate common-mode filtering inductors and differential-mode filtering inductors into a magnetic core. FIG. 2 (Prior Art) illustrates the structure of a conventional integrated filter, developed by Motorola. The magnetic core thereof comprises E-shaped core 201, I-shaped core 202 and two coils 203 and 204 wound on the I-shaped core 202. The symbols $\Phi_{DM}$ and $\Phi_{CM}$ represent the magnetic flux of the differential-mode signal and the magnetic flux of the common-mode signal, respectively. The advantage of such a structure is its use of only one winding frame, wherein two coils can be wound on the same winding frame. The common-mode and differential-mode inductance values can be adjusted by modulating three air gaps pertaining to magnetic branches of the E-shaped core 201. However, this magnetic core structure having air gaps therein may influence the common-mode inductance values since the air gaps in the route of magnetic fluxes of the common-mode signals are not zero. In addition, the routes of differential-mode flux $\Phi_{DM}$ and the common-mode flux $\Phi_{CM}$ partially overlap. Therefore, the common-mode inductance value may be influenced since the differential-mode flux $\Phi_{DM}$ decreases the effective permeability of the magnetic core.

FIGS. 3A and 3B (Prior Art) illustrate a conventional integrated filter developed by Magnetek and disclosed in the U.S. Pat. No. 5,731,666, which includes two embodiments. The first embodiment, as shown in FIG. 3A, is similar to that shown in FIG. 2 except that a U-shaped core 31 and an I-shaped core 50 are used to replace the E-shaped core. The I-shaped core is made of low-permeability material. FIG. 3B illustrates the second embodiment. The integrated inductor is composed of a circular core 310 and an I-shaped core 320. However, in these two embodiments, the I-shaped core must be mounted on the inside of the circular core or the U-shaped core, which complicates the fabrication and installation processes. In addition, it is inconvenient to wind coils on the circular core. Therefore, production efficiency will decrease.

FIGS. 4A and 4B (Prior Art) illustrate a conventional integrated filter developed by Powercube and disclosed in U.S. Pat. No. 5,319,343. The windings 64 and 68 and the windings 66 and 70 shown in FIG. 4A are a combination of differential-mode inductors 76 and 78 and common-mode inductors 74 and 72 shown in FIG. 4B. The winding 62 solely constitutes the differential-mode inductor. The advantage of this magnetic core structure and winding arrangement is that the winding on the center column does not interact with the windings on the upper and lower columns of the magnetic core and the magnetic flux on the center column is only associated with the winding 62. However, this proposal is still unfavorable to implementation.

SUMMARY OF THE INVENTION

Accordingly, the objective of the present invention is to provide an integrated filter with both common-mode and differential-mode functions that can be implemented with ease.

According to the above objective, the present invention provides an integrated filter with both common-mode and differential-mode functions, which comprises a magnetic core, two windings and a frame for installing the windings. The magnetic core further comprises a rectangular core and an I-shaped core. The frame is fixed to a column of the rectangular core. In addition, two windings are wound on the frame. The I-shaped core is placed across the interior opening of the rectangular core and between these two windings.

In another aspect of the invention, the present invention also provides an integrated filter with both common-mode and differential-mode functions. The integrated filter also comprises a magnetic core, two windings and a frame for installing the windings. The magnetic core includes a θ-shaped core and an I-shaped core. The θ-shaped core has an interior opening and a central column traversing the opening. The frame is fixed to the central column of the θ-shaped core. Two windings are then wound on the frame. The I-shaped core traverses the opening of the θ-shaped core and between two windings, and is perpendicular to the central column of the θ-shaped core.

In another aspect of the invention, the present invention also provides an integrated filter with both common-mode and differential-mode functions. The integrated filter also comprises a magnetic core, two windings and a frame for installing the windings. The magnetic core includes a θ-shaped core and an E-shaped core. The frame is fixed to a central column of the θ-shaped core. Two windings are then wound on the frame. The E-shaped core is upright located on the central column of the θ-shaped core. A button surface of the E-shaped core faces the central column of the θ-shaped core. A central column of the E-shaped core is between two windings.

In another aspect of the invention, the present invention also provides an integrated filter with both common-mode and differential-mode functions. The integrated filter also comprises a magnetic core, two windings and a frame for installing the windings. The magnetic core includes a θ-shaped core and an E-shaped core. The θ-shaped core has at least one opening and a central column traversing the openings. The frame is mounted on the central column of the θ-shaped core. Two windings are then wound on the frame. The E-shaped core traverses one of the openings of the θ-shaped magnetic core. A central column of the E-shaped core is located between the first winding and the second winding.

In another aspect of the invention, the present invention also provides an integrated filter with both common-mode and differential-mode functions. The integrated filter also comprises a magnetic core, two windings and a frame for installing the windings. The magnetic core includes a rectangular core and an E-shaped core. The E-shaped core is located on a side of the rectangular core. The frame is mounted on a column of the rectangular core. A central column of the E-shaped core is located between the first winding and the second winding.

In another aspect of the invention, the present invention also provides an integrated filter with both common-mode and differential-mode functions. The integrated filter also comprises a magnetic core, two windings and a frame for installing the windings. The magnetic core includes a rectangular core and an E-shaped core. The rectangular magnetic core has an opening. The E-shaped magnetic core traverses the opening of the rectangular magnetic core. The frame is mounted on a column of the rectangular magnetic core. A central column of the E-shaped magnetic core is located between the first winding and the second winding.

As described above, the advantage of this structure is in the implementation.

BRIEF DESCRIPTION OF THE DRAWINGS

For a more complete understanding of the present invention and the advantages thereof, reference is now made to the following description taken in conjunction with the accompanying drawings in which:

FIG. 4A and FIG. 4B (Prior Art) are schematic diagrams illustrating a third example of the conventional integrated filter, wherein FIG. 4b shows an equivalent circuit of the structure shown in FIG. 4a;

DETAILED DESCRIPTION OF THE INVENTION

Figure 1A:
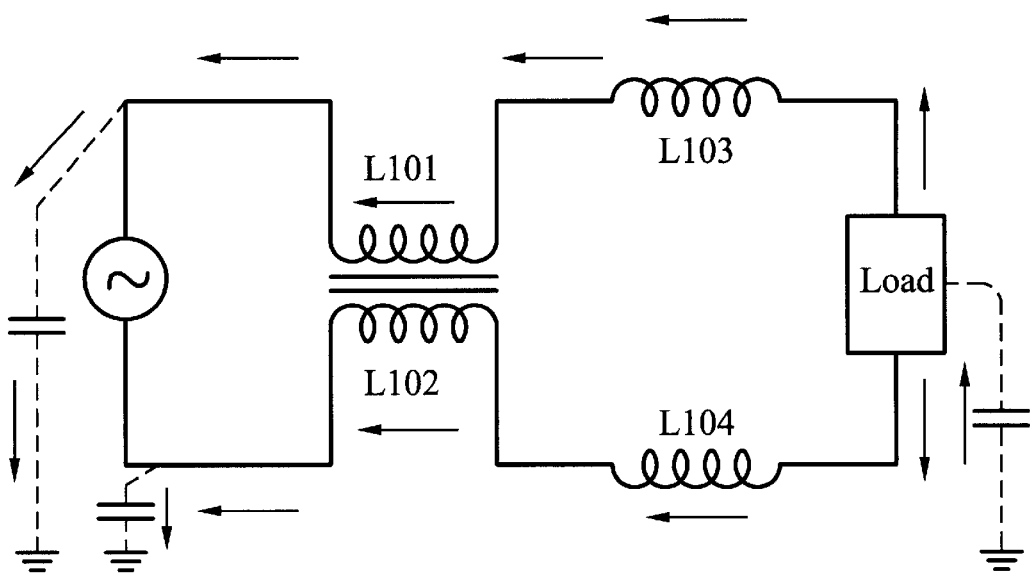
FIG. 1A and FIG. 1B (Prior Art) are schematic diagrams illustrating the EMI signal and their propagation schemes in the prior art.
Figure 1B:
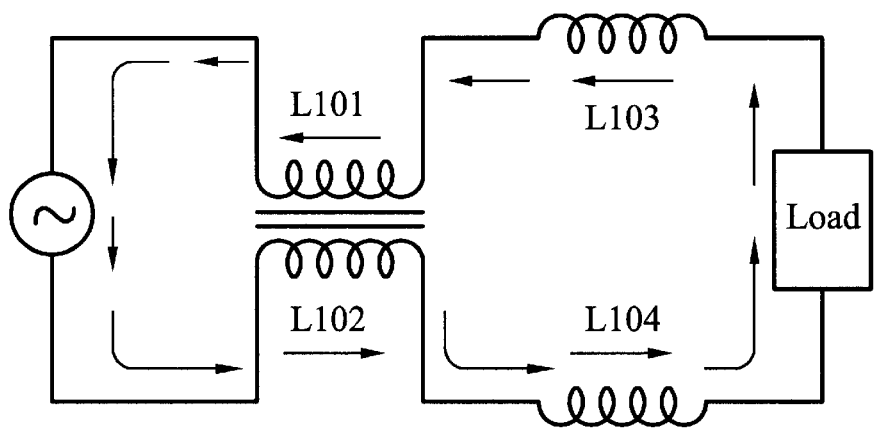
Figure 2:
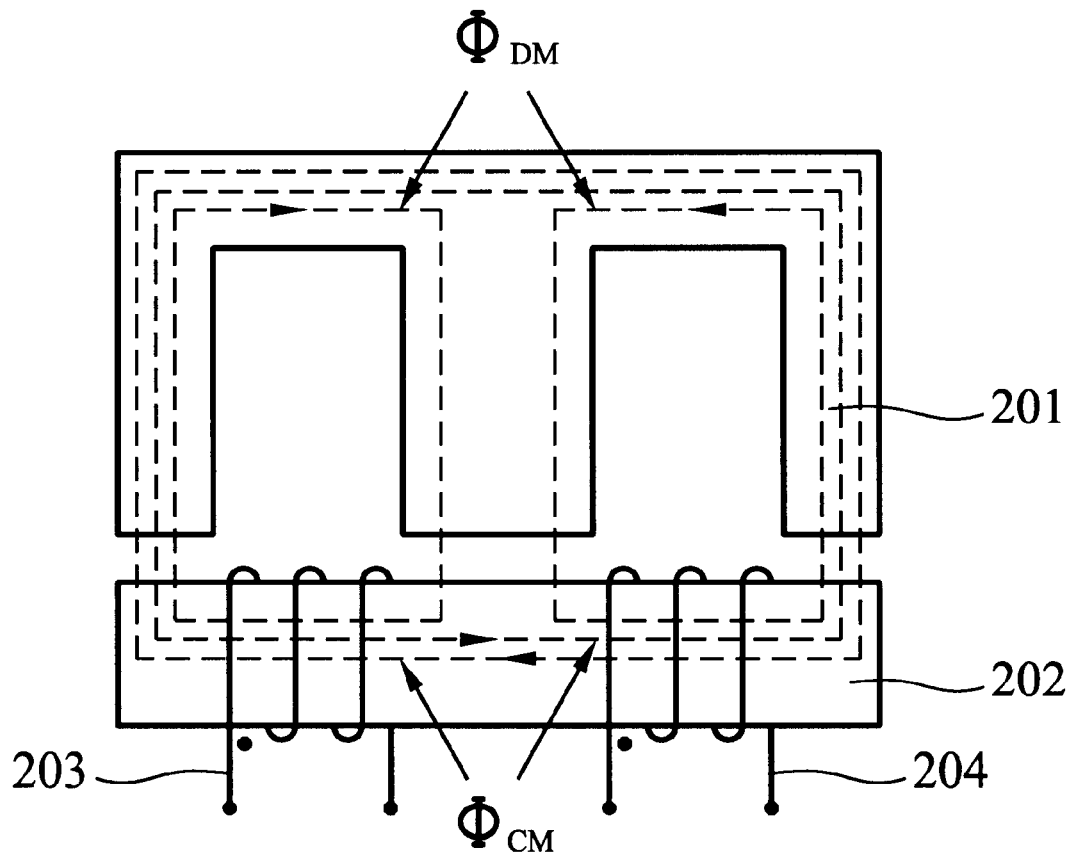
FIG. 2 (Prior Art) is a schematic diagram illustrating a first example of the conventional integrated filter.
Figure 3A:
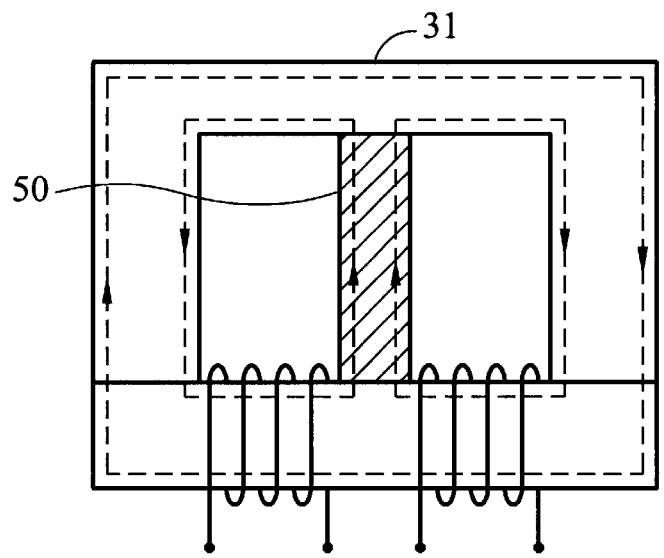
FIG. 3A and FIG. 3B (Prior Art) are schematic diagrams illustrating a second example of the conventional integrated filter.
Figure 3B:
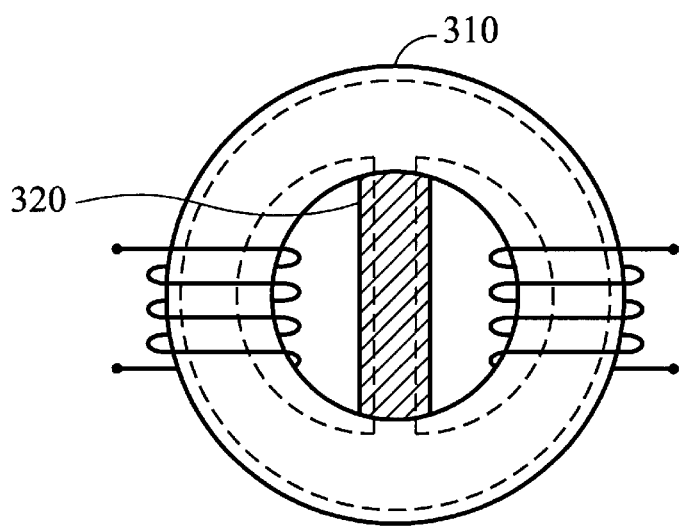
Figure 4A:
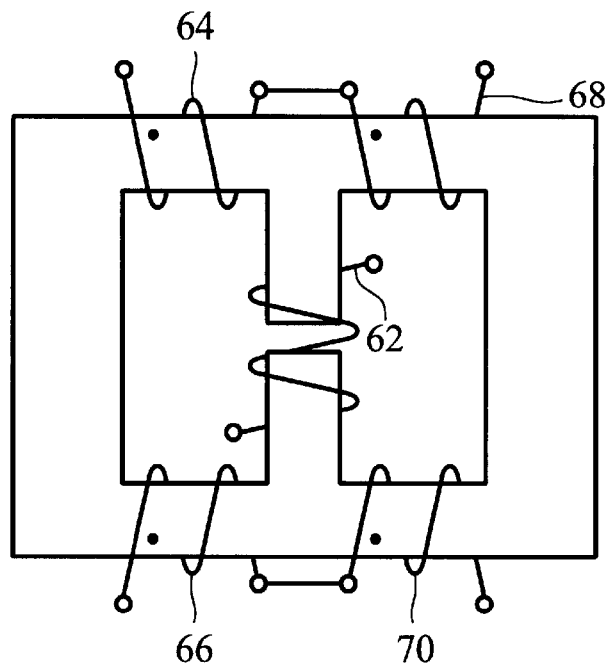
Figure 4B:
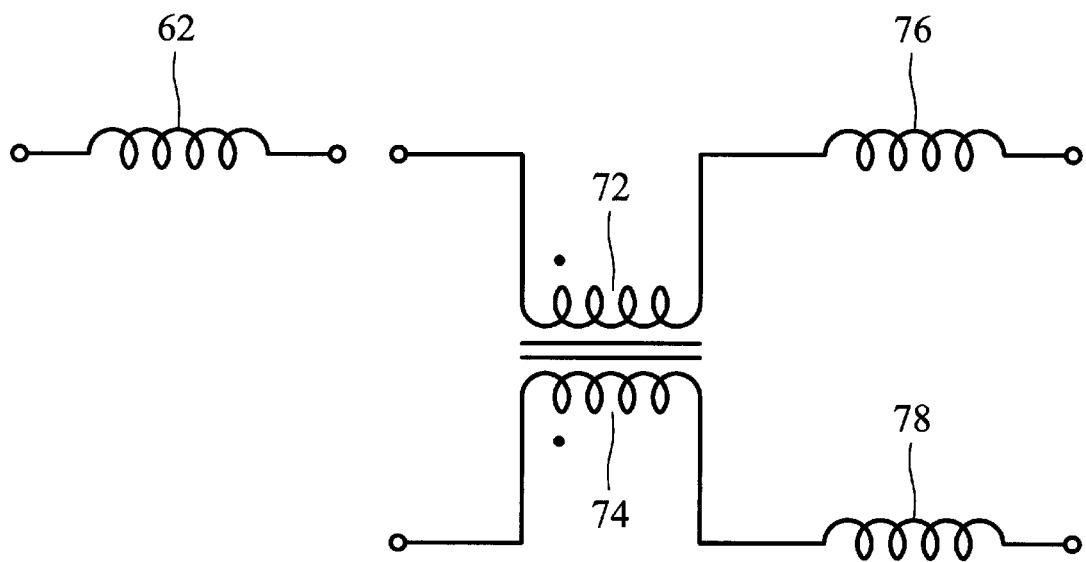
Figure 5:
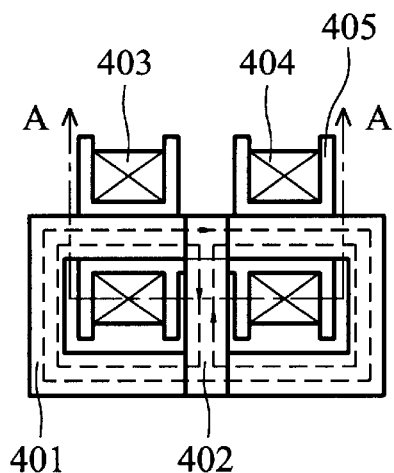
FIG. 5 is a schematic diagram illustrating the integrated filter with both common-mode and differential-mode functions according to the first embodiment of the present invention.

As shown in FIG. 5, the integrated filter with common-mode and differential-mode functions in the first embodiment comprises a rectangular core 401 with an opening and an I-shaped core 402. In addition, a frame 405 used for the assembly of two windings 403 and 404 is fixed to a column of the rectangular core 401. The I-shaped core 402 is placed across the opening of the rectangular core 401 and its location is located between the winding 403 and the winding 404. The assembly process of the above-identified integrated filter is described as follows. First, a rectangular core 401 and an I-shaped core 402 are prepared. Then, frame 405 is fixed to a column of the rectangular core 401 and two windings 403 and 404 are wound on the frame 405. Finally, the I-shaped core 402 is mounted across the opening of the rectangular core 401 to fulfill the integrated filter as shown in FIG. 5.

In this embodiment, I-shaped core 402 is preferably made of materials with low magnetic permeability and highly saturated magnetic density, appropriate for the magnetic flux of the differential-mode signals. The rectangular core 401 is preferably made of materials with high magnetic permeability, which can effectively suppress the common-mode signals.

Figure 6:
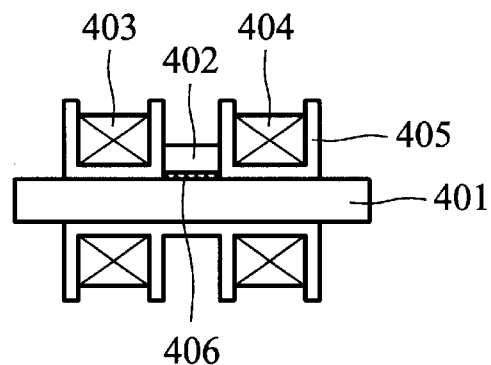
FIG. 6 shows a magnified sectional view of the structure shown in FIG. 5 along the line A—A.

FIG. 6 is a magnified sectional view of the structure shown in FIG. 5 along the line A—A. As shown in FIG. 6, a non-magnetic pad 406 is installed at the joints of the I-shaped core 402 and the rectangular core 401, thereby forming an air gap for adjusting the differential-mode inductance values. However, the air separation scheme also can be used to achieve the same function.

Figure 7:
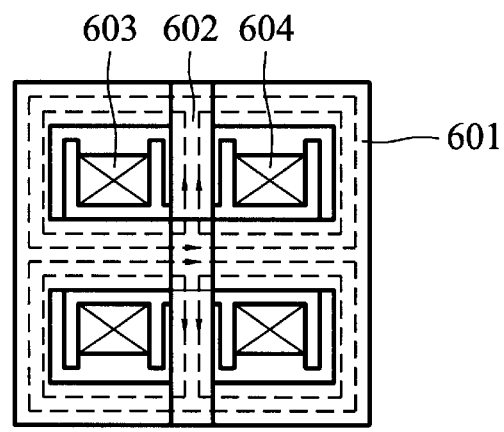
FIG. 7 is a schematic diagram illustrating the second embodiment of the integrated-magnetic filter with both common-mode and differential-mode functions according to the present invention.

FIG. 7 is a schematic diagram illustrating the second embodiment of the integrated filter with common-mode and differential-mode functions in the present invention. The difference between the embodiment shown in FIG. 5 and the embodiment shown in FIG. 7 is the use of a θ-shaped core 601 in place of the rectangular core 401 in the embodiment shown in FIG. 5. The I-shaped core 602 traverses the opening of the θ-shaped core 601 and is perpendicular to the central column of the θ-shaped core 601. In addition, the I-shaped core 602 is located between the winding 603 and the winding 604.

The other components and structures in the embodiment shown in FIG. 7 are almost the same as those in the embodiment shown in FIG. 5. For example, a pad or air-separation mechanism can be placed at the joints of the I-shaped core 602 and the θ-shaped core 601.

Figure 8A:
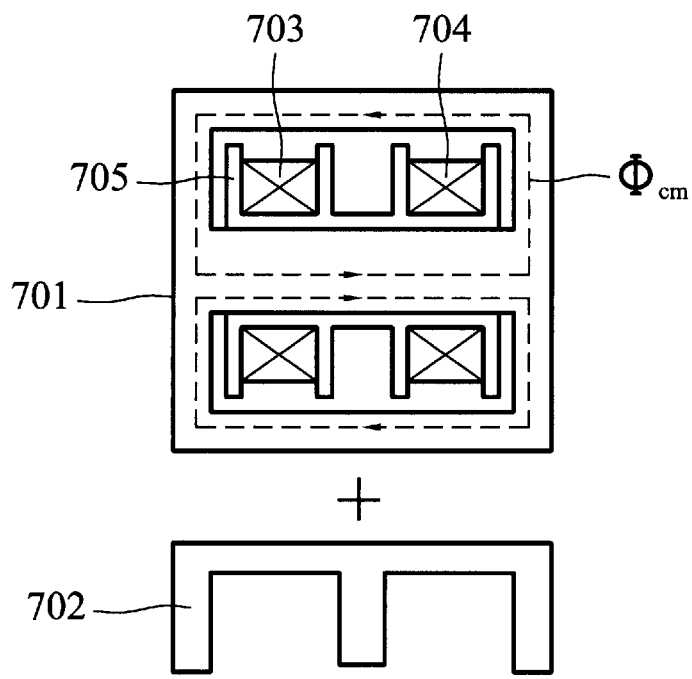
FIG. 8A, FIG. 8B and FIG. 8c are schematic diagrams illustrating the integrated filter with both common-mode and differential-mode functions according to the third embodiment of the present invention.
Figure 8B:
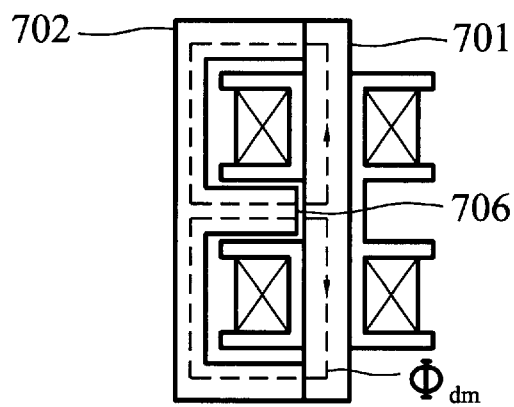
Figure 8C:
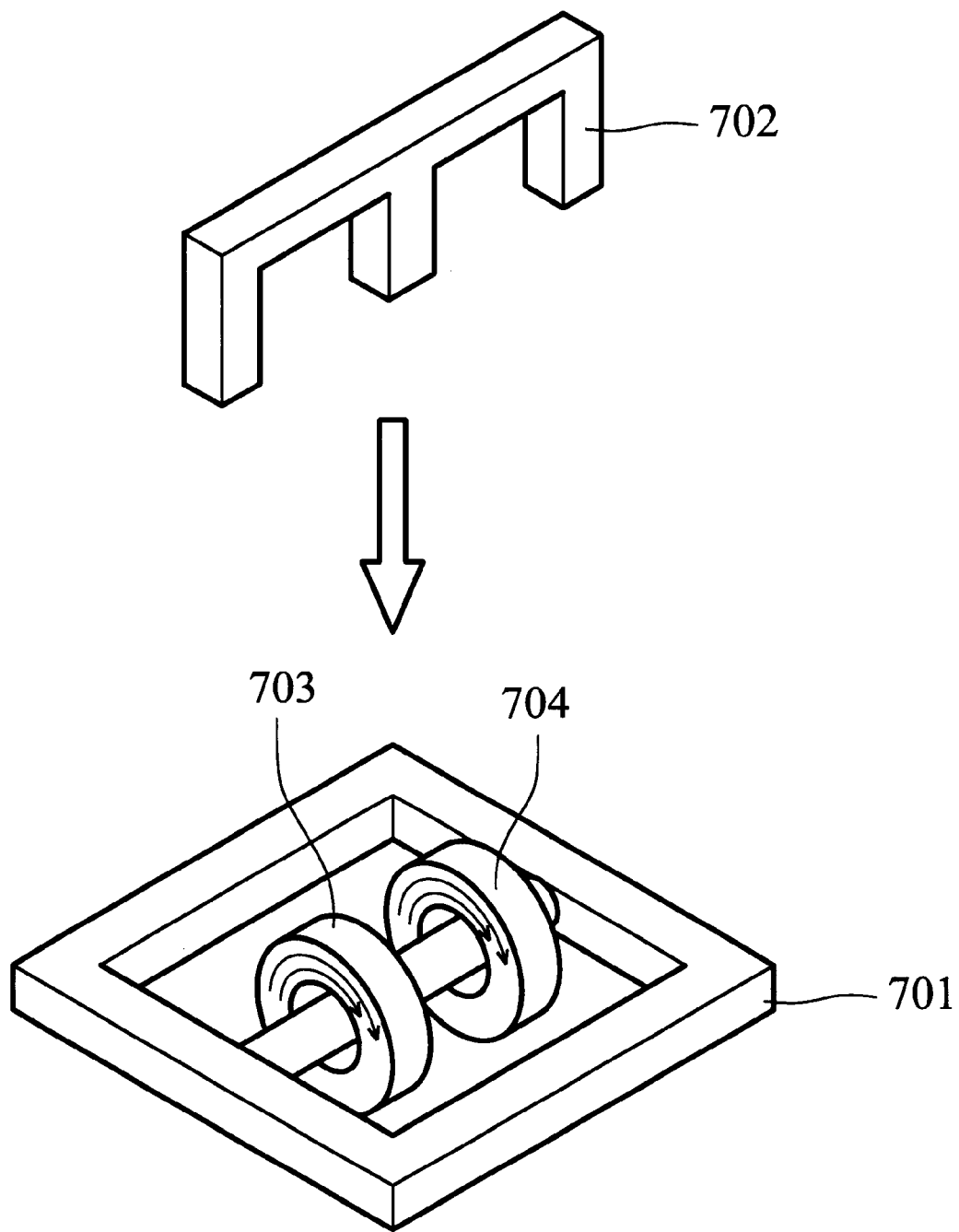

As shown in FIGS. 8A–8c, the integrated filter with common-mode and differential-mode functions in the third embodiment comprises a θ-shaped core 701 with a central column and an E-shaped core 702 with a central column. In addition, a frame 705 used for the assembly of two windings 703 and 704 is fixed to the central column of the rectangular core 701. The E-shaped core 702, as shown in FIG. 8C, is upright placed the central column of the θ-shaped core 701. The central column of the E-shaped core 702 is located between the winding 703 and the winding 704. The assembly process of the above-identified integrated filter is described as follows. First, a θ-shaped core 701 and an E-shaped core 702 are prepared. Then, frame 705 is fixed to a central column of the θ-shaped core 701 and two windings 703 and 704 are wound on the frame 705. Finally, the E-shaped core 702 is upright placed on the central column of the θ-shaped core 701 to fulfill the integrated filter as shown in FIG. 8B. As shown in FIG. 8B and FIG. 8C, the routes of a common mode magnetic flux $\Phi_{cm}$ and a differential mode magnetic flux $\Phi_{dm}$ are overlapped only on the central column of the θ-shaped core 701. The advantage of the architecture is that the common routes of the common-mode magnetic flux and the differential-mode magnetic flux are shorter. Therefore, the structure can avoid the decrease of the inductance value, which is influenced by the common-mode magnetic flux, the differential-mode magnetic flux, or work currents. The structure also addresses the suppression of the noise.

In this embodiment, E-shaped core 702 is preferably made of materials with low magnetic permeability and highly saturated magnetic density, appropriate for the magnetic flux of the differential-mode signals. The θ-shaped core 701 is preferably made of materials with high magnetic permeability, which can effectively suppress the common-mode signals.

As shown in FIG. 8B, an air pad 706 is located at the joints of the θ-shaped core 701 and the E-shaped core 702. The air gap adjusts the differential-mode inductance values by changing the length of the central column of the E-shaped core 702. The winding numbers of the two windings 703 and 704 adjust the common-mode inductance values. The winding numbers of the windings 703 and 704, typically, are set to be the same.

Figure 9A:
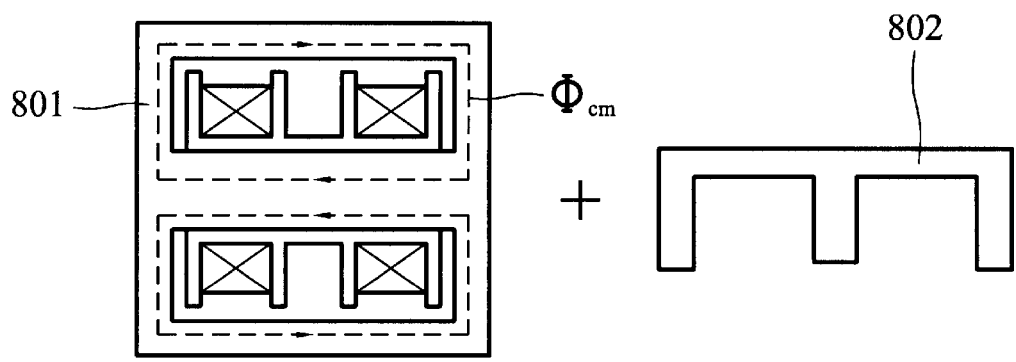
FIG. 9A, FIG. 9B and FIG. 9c are schematic diagrams illustrating the forth embodiment of the integrated-magnetic filter with both common-mode and differential-mode functions according to the present invention.
Figure 9B:
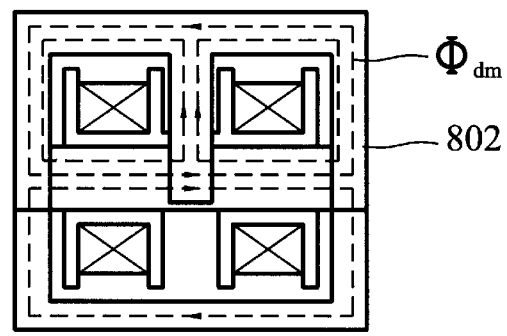
Figure 9C:
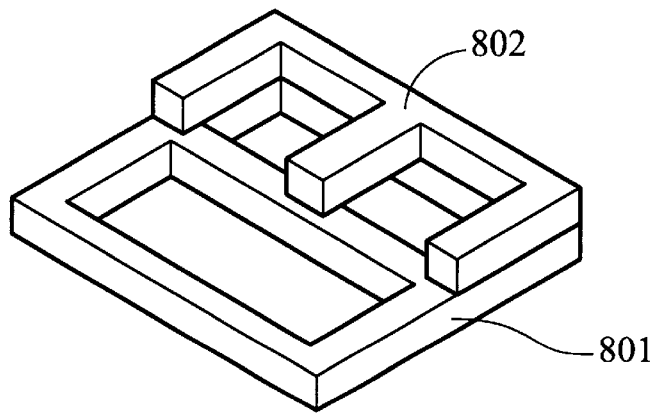

FIG. 9A, FIG. 9B and FIG. 9c are schematic diagrams illustrating the fourth embodiment of the integrated filter with common-mode and differential-mode functions in the present invention. The components and structures in the embodiment shown in FIG. 9A~FIG. 9C are almost the same as those in the embodiment shown in FIG. 8A~FIG. 8c. The difference of the structure is an E-shaped core 802 traverses one of openings of a θ-shaped magnetic core 801.

Figure 10:
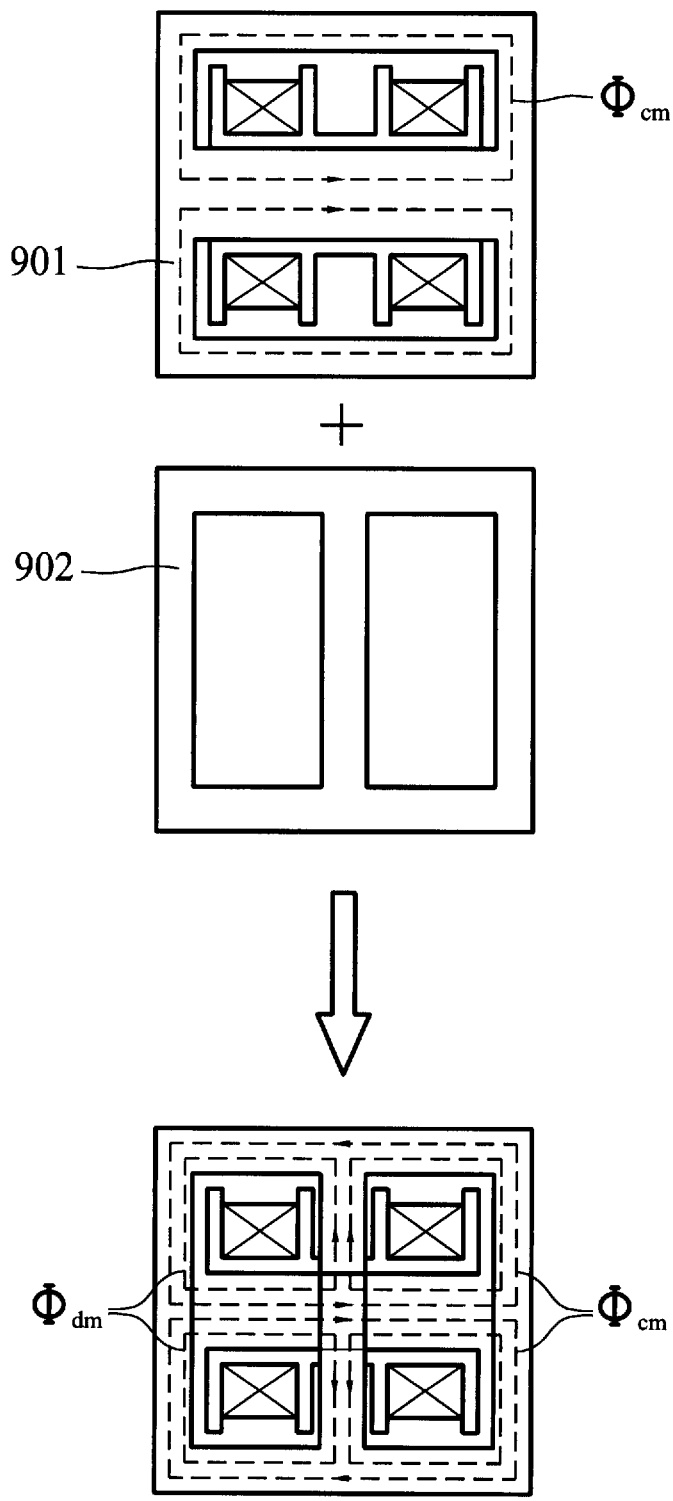
FIG. 10 is a schematic diagram illustrating the integrated filter with both common-mode and differential-mode functions according to the fifth embodiment of the present invention.

As shown in FIG. 10, the integrated filter with common-mode and differential-mode functions in the fifth embodiment comprises two θ-shaped core 901 and 902. One θ-shaped core 901 is an original core of the integrated filter with common-mode. The other θ-shaped core 902 is placed across the θ-shaped core 901, formed the form shown in FIG. 10. The θ-shaped core may be formed by two E-shaped magnetic cores that are mounted in relative positions. The structure, shown in FIG. 10, has the advantage that is the shortest common routes of the common-mode magnetic flux and the differential-mode magnetic flux.

Figure 11A:
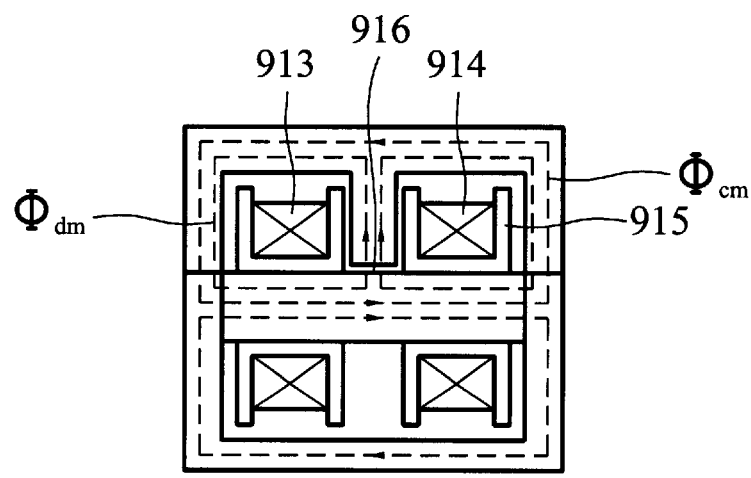
FIG. 11A and FIG. 11B are schematic diagrams illustrating the sixth embodiment of the integrated-magnetic filter with both common-mode and differential-mode functions according to the present invention.
Figure 11B:
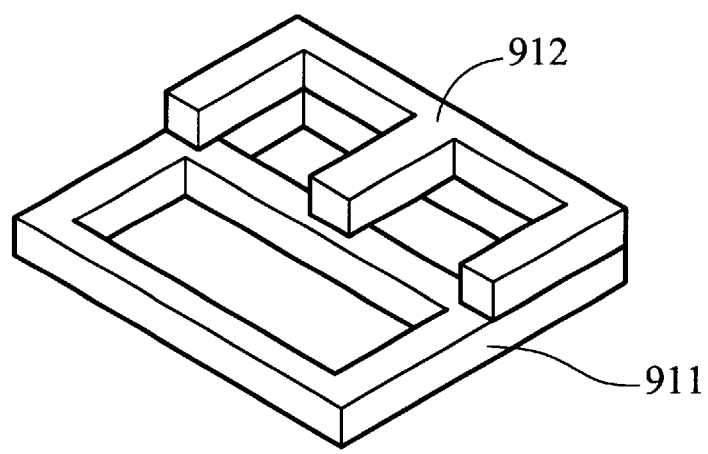

FIG. 11A and FIG. 11B are schematic diagrams illustrating the sixth embodiment of the integrated-magnetic filter with both common-mode and differential-mode functions according to the present invention. In the embodiment, a structure composed of a rectangular core and an E-shaped core is disclosed. As shown in FIG. 11A and FIG. 11B, the integrated filter with common-mode and differential-mode functions in the embodiment comprises a rectangular core 911 and an E-shaped core 912 with a central column. In addition, a frame 915 used for the assembly of two windings 913 and 914 is fixed to a column of the rectangular core 911. The E-shaped magnetic core 912 is located on a side of the rectangular magnetic 911. The central column of the E-shaped core 912 is located between the winding 913 and the winding 914. The assembly process of the above-identified integrated filter is described as follows. First, a rectangular core 911 and an E-shaped core 912 are prepared. Then, frame 915 is fixed to a central column of the rectangular core 911 and two windings 913 and 914 are wound on the frame 915. Finally, the E-shaped core 912 is upright placed on the central column of the rectangular core 911 to fulfill the integrated filter as shown in FIG. 11B. As shown in FIG. 11A, the routes of a common mode magnetic flux $\Phi_{cm}$ and a differential mode magnetic flux $\Phi_{dm}$ are overlapped only on the central column of the rectangular core 911. The advantage of the architecture is that the common routes of the common-mode magnetic flux and the differential-mode magnetic flux are shorter. Therefore, the structure can avoid the decrease of the inductance value, which is influenced by the common-mode magnetic flux, the differential-mode magnetic flux, or work currents. The structure also addresses the suppression of the noise.

In this embodiment, E-shaped core 912 is preferably made of materials with low magnetic permeability and highly saturated magnetic density, appropriate for the magnetic flux of the differential-mode signals. The rectangular core 911 is preferably made of materials with high magnetic permeability, which can effectively suppress the common-mode signals.

As shown in FIG. 11A, an air pad 916 is located at the joints of the rectangular core 911 and the E-shaped core 912. The air gap adjusts the differential-mode inductance values by changing the length of the central column of the E-shaped core 912. The winding numbers of the two windings 913 and 914 adjust the common-mode inductance values. The winding numbers of the windings 913 and 914, typically, are set to be the same.

Figure 12A:
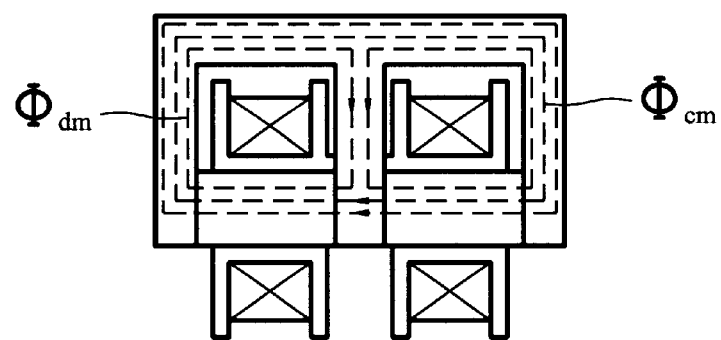
FIG. 12A and FIG. 12B are schematic diagrams illustrating the seventh embodiment of the integrated-magnetic filter with both common-mode and differential-mode functions according to the present invention.
Figure 12B:
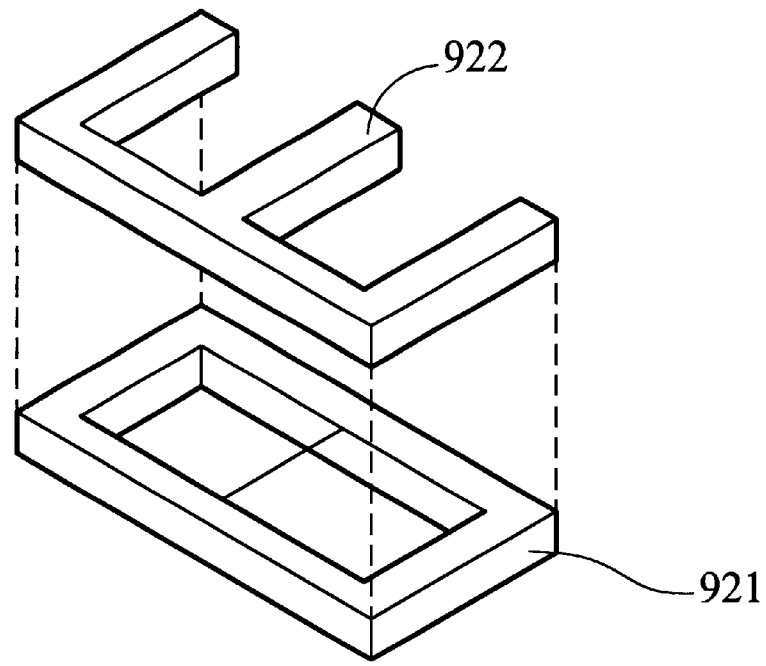

FIG. 12A and FIG. 12B are schematic diagrams illustrating the seventh embodiment of the integrated filter with common-mode and differential-mode functions in the present invention. The components and structures in the embodiment shown in FIG. 12A and FIG. 12B are almost the same as those in the embodiment shown in FIG. 11. The difference of the structure is an E-shaped core 922 traverses an opening of a rectangular magnetic core 921. The effect that the seventh embodiment shown in FIG. 12A and FIG. 12B can be achieved is the same the effect that the sixth embodiment shown in FIG. 11A and FIG. 11B can be achieved.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all this modifications and similar arrangements.

What is claimed is:

1. An integrated filter with both common-mode and differential-mode functions, comprising:

a rectangular magnetic core with an opening therein;

an I-shaped magnetic core traversing the opening of the rectangular magnetic core;

a frame mounted on a column of the rectangular magnetic core; and a first winding and a second winding installed on the frame, the I-shaped magnetic core being located between the first winding and the second winding.

2. The integrated filter of claim 1, wherein the I-shaped magnetic core is made of material with low magnetic permeability and highly saturated magnetic density and the rectangular magnetic core is made of material with low magnetic permeability.

3. The integrated filter of claim 1, further comprising a non-magnetic pad mounted at a joint of the rectangular magnetic core and the I-shaped magnetic core.

4. The integrated filter of claim 3, wherein the I-shaped magnetic core is made of material with low magnetic permeability and highly saturated magnetic density and the rectangular magnetic core is made of material with low magnetic permeability.

5. An integrated filter with both common-mode and differential-mode functions, comprising:

a θ-shaped magnetic core with an opening and a central column traversing the opening;

an I-shaped magnetic core traversing the opening of the θ-shaped magnetic core and perpendicular to the central column of the θ-shaped magnetic core;

a frame mounted on the central column of the θ-shaped magnetic core; and a first winding and a second winding installed on the frame, the I-shaped magnetic core located between the first winding and the second winding.

6. The integrated filter of claim 5, wherein the I-shaped magnetic core is made of material with low magnetic permeability and highly saturated magnetic density and the θ-shaped magnetic core is made of material with low magnetic permeability.

7. The integrated filter of claim 5, further comprising a non-magnetic pad mounted at a joint of the θ-shaped magnetic core and the I-shaped magnetic core.

8. The integrated filter of claim 7, wherein the I-shaped magnetic core is made of material with low magnetic permeability and highly saturated magnetic density and the rectangular magnetic core is made of material with low magnetic permeability.

9. An integrated filter with both common-mode and differential-mode functions, comprising:

a θ-shaped magnetic core with a central column;

an E-shaped magnetic core upright located on the central column of the θ-shaped magnetic core, the E-shaped magnetic core with a central column and a button surface facing the central column of the θ-shaped magnetic core;

a frame mounted on the central column of the θ-shaped magnetic core; and a first winding and a second winding installed on the frame, the central column of E-shaped magnetic core being located between the first winding and the second winding.

10. An integrated filter with both common-mode and differential-mode functions, comprising:

a θ-shaped magnetic core with at least one opening and a central column traversing the openings;

an E-shaped magnetic core traversing one of the openings of the θ-shaped magnetic core, the E-shaped magnetic core with a central column;

a frame mounted on the central column of the θ-shaped magnetic core; and a first winding and a second winding installed on the frame, the central column of the E-shaped magnetic core being located between the first winding and the second winding.

11. The integrated filter of claim 10, further comprising an second E-shaped magnetic core traversing another of the openings of the θ-shaped magnetic core, wherein the E-shaped magnetic core and the second E-shaped magnetic core are mounted in relative positions to form a θ-shaped magnetic core.

12. An integrated filter with both common-mode and differential-mode functions, comprising:

a rectangular magnetic core;

an E-shaped magnetic core located on a side of the rectangular magnetic, the E-shaped magnetic core with a central column;

a frame mounted on a column of the rectangular magnetic core; and a first winding and a second winding installed on the frame, the central column of the E-shaped magnetic core being located between the first winding and the second winding.

13. An integrated filter with both common-mode and differential-mode functions, comprising:

a rectangular magnetic core with an opening therein;

an E-shaped magnetic core traversing the opening of the rectangular magnetic core, the E-shaped magnetic core with a central column;

a frame mounted on a column of the rectangular magnetic core; and a first winding and a second winding installed on the frame, the central column of the E-shaped magnetic core being located between the first winding and the second winding.

14. The integrated filter of claim 9, wherein the E-shaped magnetic core is made of material with low magnetic permeability and highly saturated magnetic density and the θ-shaped magnetic core is made of material with low magnetic permeability.

15. The integrated filter of claim 11, wherein the E-shaped magnetic core is made of material with low magnetic permeability and highly saturated magnetic density and the θ-shaped magnetic core is made of material with low magnetic permeability.

16. The integrated filter of claim 12, wherein the E-shaped magnetic core is made of material with low magnetic permeability and highly saturated magnetic density and the rectangular magnetic core is made of material with low magnetic permeability.

17. The integrated filter of claim 13, wherein the E-shaped magnetic core is made of material with low magnetic permeability and highly saturated magnetic density and the rectangular magnetic core is made of material with low magnetic permeability.

18. The integrated filter of claim 9, further comprising an air gap located at a joint of the θ-shaped magnetic core and the I-shaped magnetic core.

19. The integrated filter of claim 12, further comprising an air gap located at a joint of the θ-shaped magnetic core and the I-shaped magnetic core.

* * * * *